United States Patent
Ning

(10) Patent No.: US 8,049,308 B2
(45) Date of Patent: Nov. 1, 2011

(54) BOND PAD FOR LOW K DIELECTRIC MATERIALS AND METHOD FOR MANUFACTURE FOR SEMICONDUCTOR DEVICES

(75) Inventor: Xian J. Ning, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 353 days.

(21) Appl. No.: 11/449,902

(22) Filed: Jun. 9, 2006

(65) Prior Publication Data

US 2007/0122597 A1  May 31, 2007

(30) Foreign Application Priority Data

Nov. 30, 2005  (CN) .......................... 2005 1 0111133

(51) Int. Cl.
*H01L 29/06* (2006.01)
(52) U.S. Cl. .. 257/619; 257/629; 257/169; 257/E23.011
(58) Field of Classification Search .................. 257/619, 257/629, 169, E23.011
See application file for complete search history.

(56) References Cited

U.S. PATENT DOCUMENTS

| | | | |
|---|---|---|---|
| 6,200,889 B1 | 3/2001 | Rolfson | |
| 6,265,246 B1 * | 7/2001 | Ruby et al. | 438/113 |
| 6,376,353 B1 | 4/2002 | Zhou et al. | |
| 6,552,433 B1 | 4/2003 | Chou et al. | |
| 6,720,261 B1 * | 4/2004 | Anderson et al. | 438/687 |
| 6,998,712 B2 * | 2/2006 | Okada et al. | 257/758 |
| 2003/0166330 A1 * | 9/2003 | Tong et al. | 438/612 |
| 2005/0179213 A1 * | 8/2005 | Huang et al. | 277/620 |
| 2005/0280149 A1 * | 12/2005 | Tsutsui et al. | 257/734 |
| 2006/0177979 A1 * | 8/2006 | Tu | 438/243 |
| 2006/0267222 A1 * | 11/2006 | Saito | 257/786 |
| 2007/0013071 A1 * | 1/2007 | Adkisson et al. | 257/758 |
| 2007/0080464 A1 * | 4/2007 | Goebel et al. | 257/774 |

* cited by examiner

*Primary Examiner* — A. Sefer
*Assistant Examiner* — Allen Parker
(74) *Attorney, Agent, or Firm* — Kilpatrick Townsend and Stockton LLP

(57) ABSTRACT

A semiconductor device having an improved contact structure. The device has a semiconductor substrate and a plurality of gate structures formed on the substrate. The device has a first interlayer dielectric overlying the gate structures. The device has a first copper interconnect layer overlying the first interlayer dielectric layer. The device also has a first low K dielectric layer overlying the first copper interconnect layer. A second copper interconnect layer is overlying the low K dielectric layer. In between the first and second copper layers is a copper ring structure enclosing an entirety of an inner region of the first low K dielectric layer. In a preferred embodiment, the copper ring structure is provided between the first copper interconnect layer and the second copper interconnect layer to maintain the inner region of the first low K dielectric layer. A bonding pad structure is overlying a region within the inner region.

20 Claims, 5 Drawing Sheets

BOND PAD FOR LOW K DIELECTRIC MATERIALS AND METHOD FOR MANUFACTURE FOR SEMICONDUCTOR DEVICES

CROSS-REFERENCES TO RELATED APPLICATIONS

This patent application claims priority to 200510111133.7 filed on Nov. 30, 2005, commonly assigned, and hereby incorporated by reference for all purposes.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to integrated circuits and their processing for the manufacture of semiconductor devices. In particular, the invention provides a method and structures for manufacturing bond pad structures for integrated circuit devices. More particularly, the invention provides a ring structure that seals a portion of a dielectric layer to maintain the dielectric layer within a predefined region while a bonding pad structure is provided on a portion of the predefined region according to a specific embodiment. But it would be recognized that the invention has a much broader range of applicability.

Over the past decades, integrated circuits have evolved from a handful of interconnected devices fabricated on a single chip of silicon to millions of devices. Performance and complexity are far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits. Certain semiconductor devices are now being fabricated with features less than a quarter of a micron across.

Increasing circuit density has not only improved the complexity and performance of circuits but also provided lower costs to consumers. Conventional semiconductor fabrication plants often costs hundreds of millions or even billions of U.S. dollars to construct. Each fabrication facility has a certain capacity measured in tens of thousands of wafer starts per month. Each wafer also has a certain number of potential chips. By manufacturing individual devices smaller and smaller, more devices are packed in a given area of semiconductor, which increases output of the fabrication facility. Making devices smaller is always very challenging, as each process for the manufacture of semiconductor devices has a limit. That is to say, a given process typically only works down to a certain feature size, and then either the process or the device layout should be changed.

Costs of operating fabrication facilities have also increased dramatically. As many know, many U.S. fabrication facilities that were operable in the 1970's and 1980's no longer exist. Many of such fabrication facilities migrated to Japan in the 1980's and then to Korea and Taiwan in the 1990's. As demand for lower cost fabrication facilities continues, China has now become a choice geographic location for fabrication facilities to start up. Many companies have announced plans to begin manufacturing facilities in China. Such companies include, but are not limited to, Motorola, Inc., Taiwan Semiconductor Manufacturing Corporation of Taiwan, also called TSMC, and others. Although labor costs may be somewhat lower in China, there are still many costs that still need to be reduced or even eliminated as the demand for lower cost silicon continues!

An example of a process that has limitations based upon a given feature size is the formation of contact and/or bonding structures for advanced devices using low K dielectric materials. That is, such contact structures using low K dielectrics often become damaged during the manufacturing of the integrated circuit. The damage causes reliability and/or device failures. Certain examples of conventional techniques can be found in U.S. Pat. Nos. 6,552,433; 6,200,889; and 6,376,353. These and other limitations of the conventional contact structures can be found throughout the present specification and more particularly below.

From the above, it is seen that an improved technique for processing semiconductor devices is desired.

BRIEF SUMMARY OF THE INVENTION

According to the present invention, techniques directed to integrated circuits and their processing for the manufacture of semiconductor devices are provided. In particular, the invention provides a method and structures for manufacturing bond pad structures for integrated circuit devices. More particularly, the invention provides a ring structure that seals a portion of a dielectric layer to maintain the dielectric layer within a predefined region while a bonding pad structure is provided on a portion of the predefined region according to a specific embodiment. But it would be recognized that the invention has a much broader range of applicability.

In a specific embodiment, the present invention provides a semiconductor device, which has an improved contact structure. The device has a semiconductor substrate, e.g., silicon wafer. The device has a plurality of gate structures (e.g., MOS gate structures) formed qn a portion of the semiconductor substrate. The device also has a gate dielectric layer and isolation structures, e.g., trench isolation. The device has a first interlayer dielectric (e.g., low K, BPSG, PSG, FSG) overlying the gate structures. In a preferred embodiment, the first interlayer dielectric layer has a substantially flat surface region. The device has a first copper interconnect layer overlying the substantially flat surface region of the first interlayer dielectric layer. The device also has a first low K dielectric layer overlying the first copper interconnect layer. A second copper interconnect layer is overlying the low K dielectric layer. In between the first and second copper layers is a copper ring structure enclosing an entirety of an inner region of the first low K dielectric layer. In a preferred embodiment, the copper ring structure is provided between the first copper interconnect layer and the second copper interconnect layer to maintain the inner region of the first low K dielectric layer. A bonding pad structure is overlying a region within the inner region.

In an alternative specific embodiment, the present invention provides a method for manufacturing a semiconductor device. The method includes providing a semiconductor substrate and forming a plurality of gate structures formed on a portion of the semiconductor substrate, e.g., silicon wafer. Gate dielectric layer and isolation structures are also provided. The method includes forming a first interlayer dielectric overlying the gate structures, the first interlayer dielectric layer having a substantially flat surface region. The method also includes forming a first copper interconnect layer overlying the substantially flat surface region of the first interlayer dielectric layer. The method includes forming a first low K dielectric layer overlying the first copper interconnect layer and forming a second copper interconnect layer overlying the low K dielectric layer. Between the first and second interconnect layers, the method forms a copper ring structure enclosing an entirety of an inner region of the first low K dielectric layer. In a preferred embodiment, the copper ring structure provided between the first copper interconnect layer and the second copper interconnect layer maintains the inner region of the first low K dielectric layer.

In a specific embodiment, the present invention provides a method for forming a bonding pad structure overlying a region within an inner region of the integrated circuit structure. The bond pad structure has metal layers that are in a vicinity of a bond pad region. The bond pad structure is divided into at least two parts from metal two to a top metal layer, which can be either two parts or a single piece. The two parts are separated by a dielectric material. The outer part has a stack of metal rings and via rings according to a specific embodiment. The metal rings (e.g., M1, M2, M3 as depicted in FIG. 3) can be a single ring or a plural rings according to a specific embodiment. Via rings (e.g., V1, V2, V3 as depicted in FIG. 3) also can be a single structure. More preferably, the via rings are a plurality of ring structures. In a specific embodiment, metal rings have a size ranging from 0.2 to 20 micrometers and the via rings have a size ranging from about 0.05 to 10 micrometers. The via and/or metal rings can be annular, circular, rectangular, trapezoidal, or polygon in shape, and the like. In a specific embodiment, the inner part of the structure can be a regular conventional design including a plurality of graded metal lines rather than a single piece metal plate. In a specific embodiment, the two part are preferred to have electrical connection, through metal wires.

In a specific embodiment using a copper metallization process, the invention includes a bond pad structure made of an aluminum bearing species, e.g. aluminum copper. The aluminum pad is preferably provided on top of an inner part of a copper structure as will be illustrated in more detail below. The aluminum metallization can have a flat surface and bottom portion to electrically and physically contact to the copper and/or have a patterned bottom portion for contacting to the copper, which will also be described more fully below. Of course, there can be other variations, modifications, and alternatives.

In a specific embodiment, the present invention can include one or more of the features noted below.
1. In a specific embodiment, the present invention provides a method and a stacked bond pad structure with a middle layer (except top and bottom) pads designed in two parts: inner functional and out stack ring protection part. The stacked bond pad structure is especially useful in low K dielectric and copper metal interconnect structures.
2. The stack ring can be single ring but preferred to be plural rings to have better protection according to a specific embodiment.
3. In a specific embodiment, the method and structure has a top aluminum bond pad that is provided on an inner part of the structure with patterned bottom or flat bottom.

Depending upon the embodiment, one or more of the above features can be included. Of course, there can be other variations, modifications, and alternatives.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration for design rules of 90 nanometers and less or 65 nanometers and less. Additionally, the invention provides for increased strength in bonding pad structures that may employ Low k dielectric materials, e.g., dielectric constant of $SiO_2$ of about k=3.5 and less (e.g., doping with fluorine to produce fluorinated silica glass, or commonly termed FSG), dielectric constant K=3 and less, or K=2.9 and less. Preferably, the present method and structures prevents any delaminating of layers using low K dielectric and bonding due to compression influences associated with the bonding pad. Depending upon the embodiment, one or more of these benefits may be achieved. These arid other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques directed to integrated circuits and their processing for the manufacture of semiconductor devices are provided. In particular, the invention provides a method and structures for manufacturing bond pad structures for integrated circuit devices. More particularly, the invention provides a ring structure that seals a portion of a dielectric layer to maintain the dielectric layer within a predefined region while a bonding pad structure is provided on a portion of the predefined region according to a specific embodiment. But it would be recognized that the invention has a much broader range of applicability.

As an integrated circuit is formed a semiconductor substrate, the circuit is subjected to mechanical stresses. For example, during bonding of a chip, mechanical force applied to the chip, particularly at the bond pads, which is physically contacted. I discovered that stress arises from wire bonding, which can lead to and cause dielectric film cracking around the pad area which propagate into circuit area causing failure. The limitation is especially pronounced in the situation where materials with large modulus differences, e.g. low K dielectric and copper. There have been attempts to provide the copper structures underneath the bond pad a graded shape to reduce force applied on the softer dielectrics. According to the present invention, we have provided a method and structure of a bond pad that forms a sealed structure around the pad area to isolate the area that under the applied force from the rest of the circuit and hence reduce the crack propagation to the active circuit. Further details of the present invention can be found throughout the present specification and more particularly below.

Figure 1:
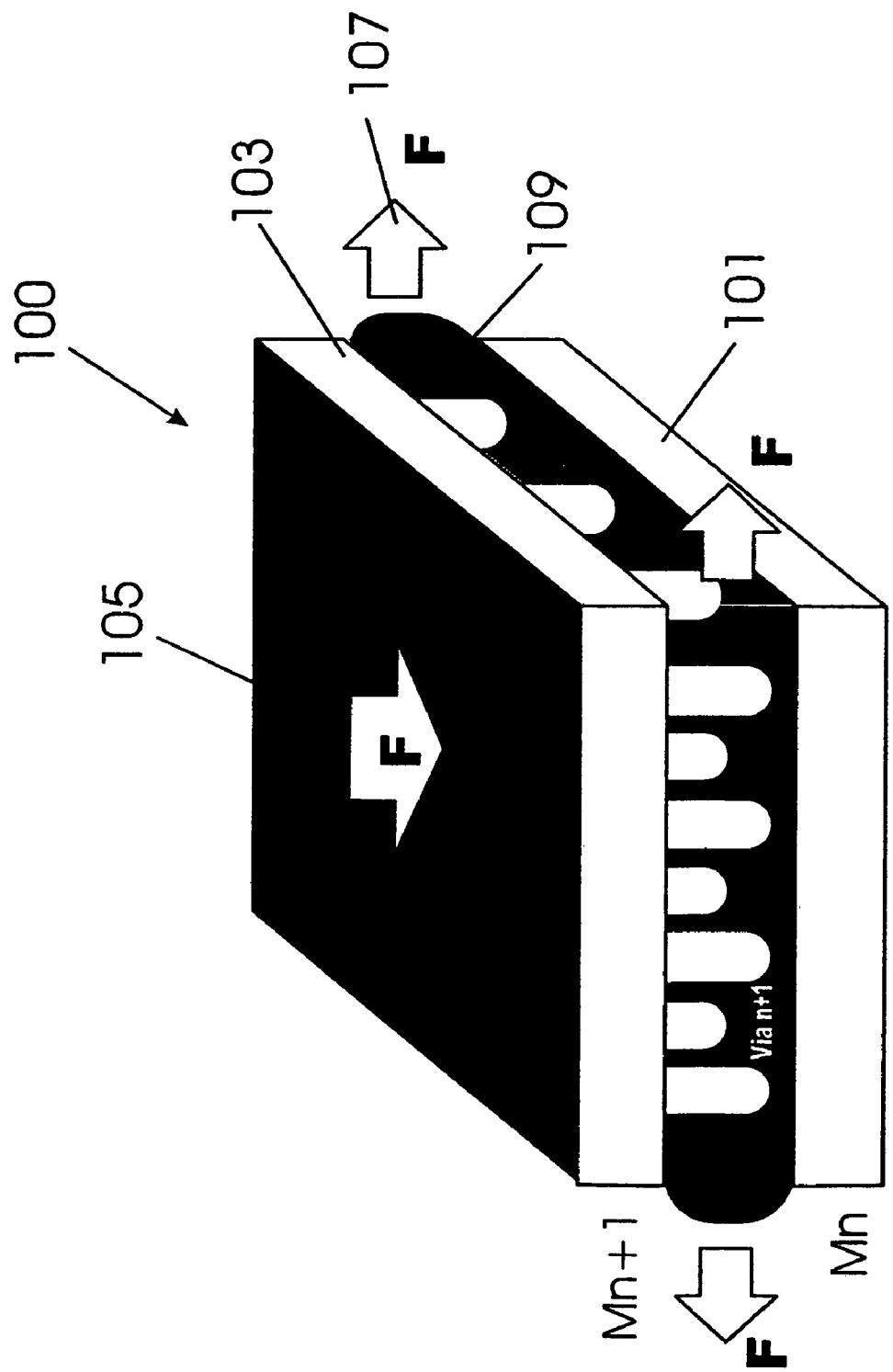
FIG. 1 is a simplified three dimensional diagram of a contact structure for a semiconductor device according to an embodiment of the present invention.

FIG. 1 is a simplified three dimensional diagram of a contact structure 100 for a semiconductor device according to an embodiment of the present invention. This diagram is merely an example, which should not unduly limit the scope of the claims herein. One of ordinary skill in the art would recognize many variations, modifications, and alternatives. In a specific embodiment, the device has a semiconductor substrate, e.g., silicon wafer. The device has a plurality of gate structures (e.g., MOS gate structures) formed on a portion of the semiconductor substrate. The device also has a gate dielectric layer and isolation structures, e.g., trench isolation. The device has a first interlayer dielectric (e.g., low K, BPSG, PSG, FSG) overlying the gate structures. In a preferred embodiment, the first interlayer dielectric layer has a substantially flat surface region. Depending upon the embodiment, there can be other variations, modifications, and alternatives.

In a specific embodiment, the device has a first copper interconnect layer 101 overlying the substantially flat surface region of the first interlayer dielectric layer. The device also has a first low K dielectric layer 109 overlying the first copper interconnect layer. A second copper interconnect layer 103 is overlying the low K dielectric layer. In between the first and second copper layers is a copper ring structure (not shown, but see the figures below) enclosing an entirety of an inner region of the first low K dielectric layer. In a preferred embodiment, the copper ring structure is provided between the first copper interconnect layer and the second copper interconnect layer to maintain the inner region of the first low K dielectric layer. A bonding pad structure is overlying a region within the inner region. As shown without the ring structure, the dielectric material in between the two metal plates transfer the applied force 105 into the dielectric material 107, which causes force to neighboring circuits, which can lead to failure. Further details on how to overcome the limitation among others will be described throughout the present specification and more particularly below.

Figure 2:
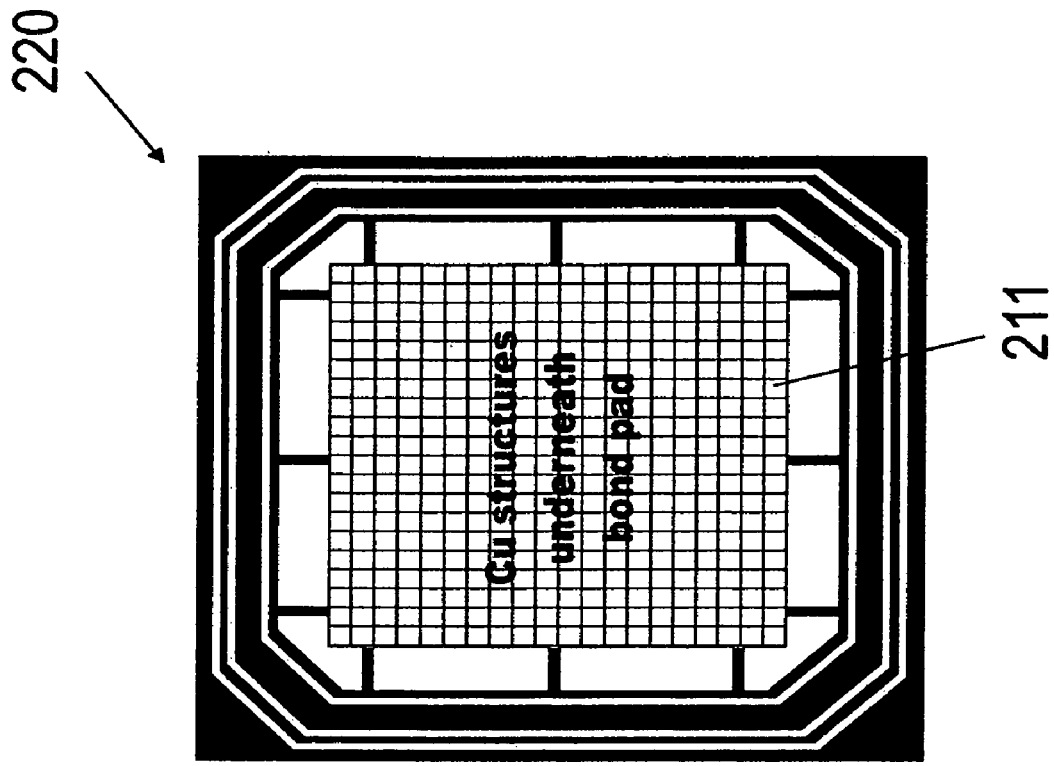
FIG. 2 are simplified top-view diagrams of contact structures according to embodiments of the present invention.
Figure 2:
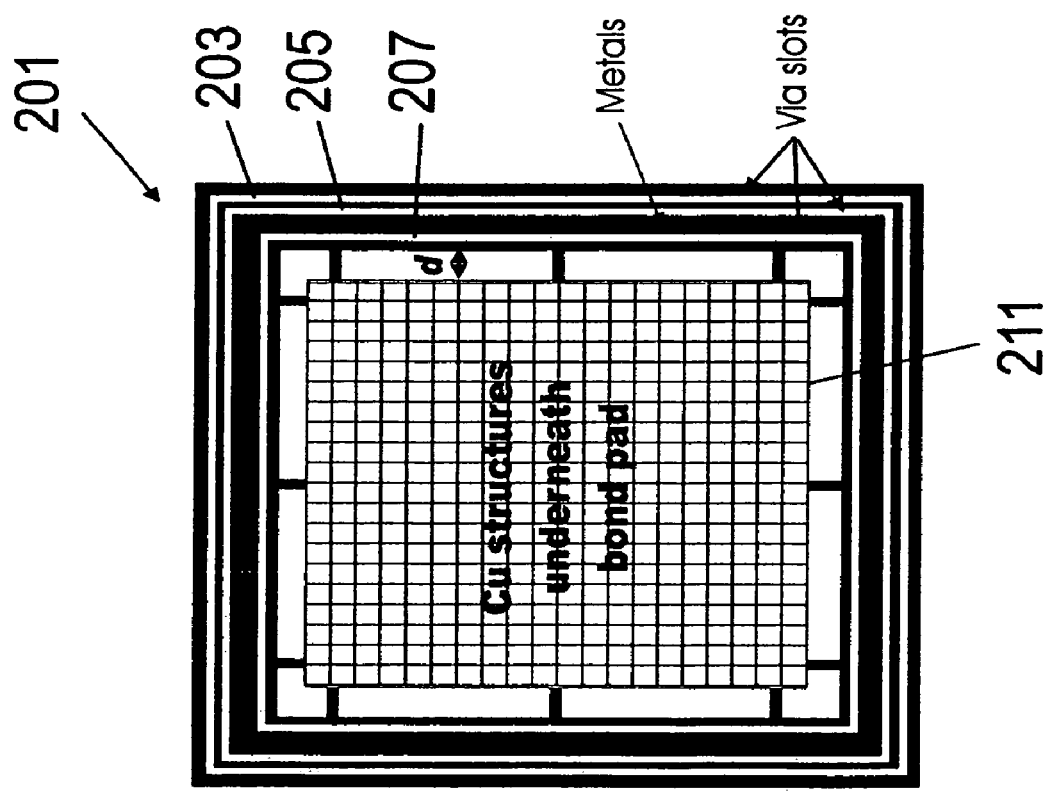

FIG. 2 are simplified top-view diagrams of contact structures 201, 220 according to embodiments of the present invention. This diagram is merely an example, which should not unduly limit the scope of the claims herein. One of ordinary skill in the art would recognize many variations, modifications, and alternatives. As shown, each of the contact structures 201 220 represent a top view of a metal pad structure, which will be underlying a bond pad structure. Each of the structures 211, which are copper based, including one or more ring structures 203, 205, 207 according to a specific embodiment. Each of the ring structures is provided during via formation of the copper structures according to a specific embodiment. Each of the structures is continuous and surrounds the dielectric material within a center portion of the copper structures.

In a preferred embodiment, each of the ring structures is bounded by the first copper interconnect layer and the second copper interconnect layer. Each of the ring structures can also have a dielectric material in between them according to a specific embodiment. As shown, the structure 201 is rectangular shaped and structure 220 has a round cornered polygon shape according to a specific embodiment. Depending upon the embodiment, there can be other shapes and sizes, including annular, circular, square, trapezoidal, any combination of these, among others. Of course, one of ordinary skill in the art would recognize many variations, modifications, and alternatives.

Figure 3:
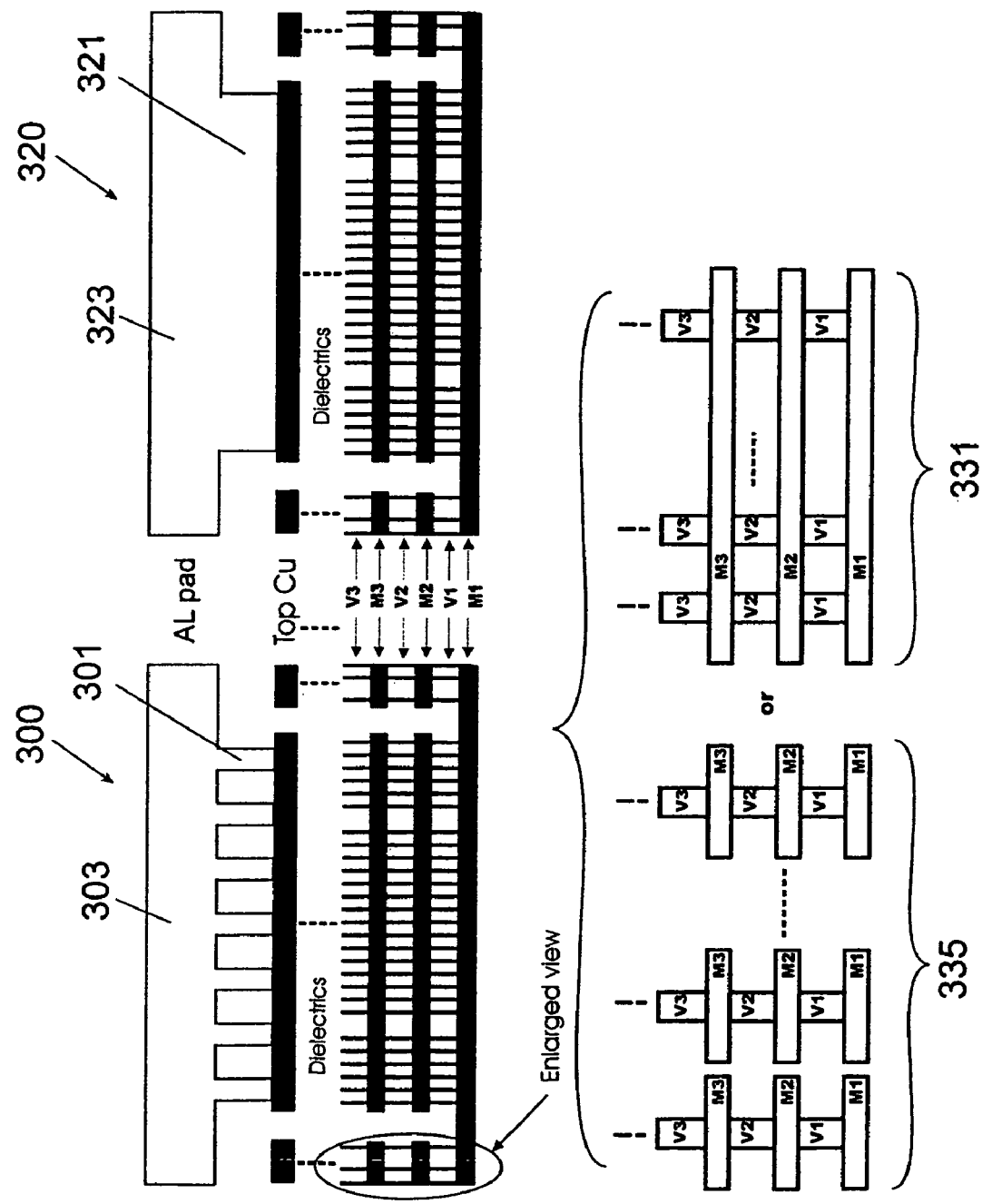
FIG. 3 are simplified side-view diagrams of contact structures according to embodiments of the present invention.

FIG. 3 are simplified side-view diagrams of contact structures 300, 320 according to embodiments of the present invention. This diagram is merely an example, which should not unduly limit the scope of the claims herein. One of ordinary skill in the art would recognize many variations, modifications, and alternatives. As shown, the contact structures illustrate cross-sectional views of bonding pad structures according to an embodiment of the present invention. In a specific embodiment, the cross-sectional view includes a top aluminum bond pad 303 having a patterned bottom portion 301, which electrically and physically connects to the copper metal layer. In a specific embodiment, the bond pad 323 has a flat bottom portion, which is continuous 321, and electrically and physically couples to the copper metal layer. The structure also has a plurality of metal ring structures 331 or a single ring structure 335 according to a specific embodiment. Each of the ring structures seals the dielectric material within the center region of the ring structure and provides mechanical support between each of the copper metal plates according to a specific embodiment. Further details of the present metal structures and methods can be found throughout the present specification and more particularly below.

Figure 4:
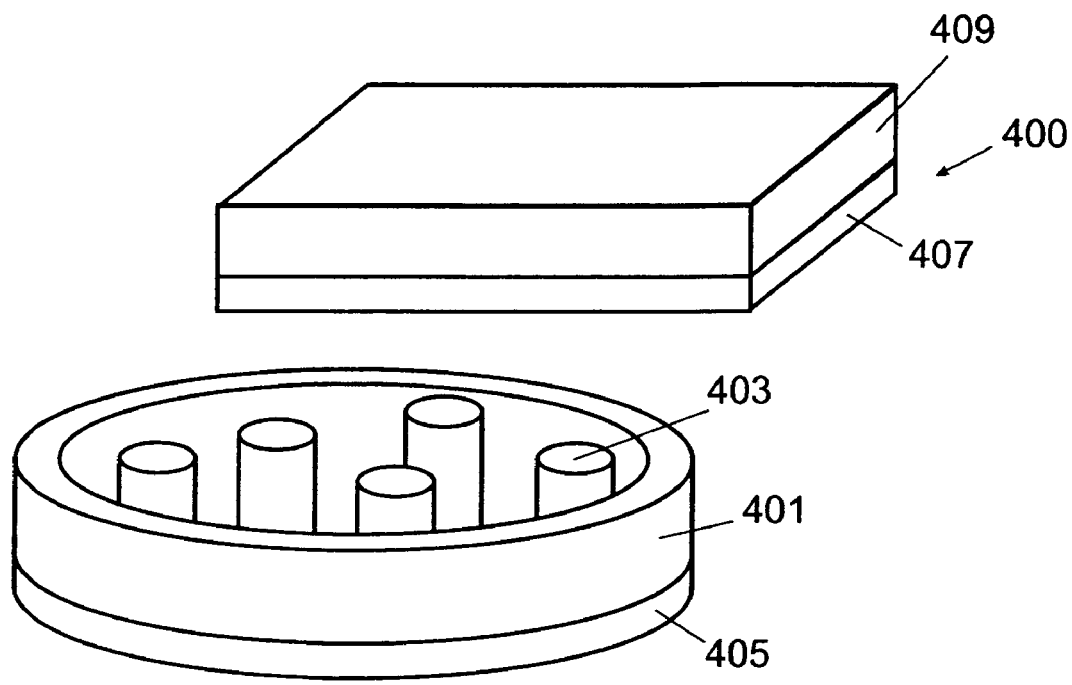
FIGS. 4 and 5 are simplified three dimensional diagrams of contact structures for semiconductor devices according to embodiments of the present invention.
Figure 5:
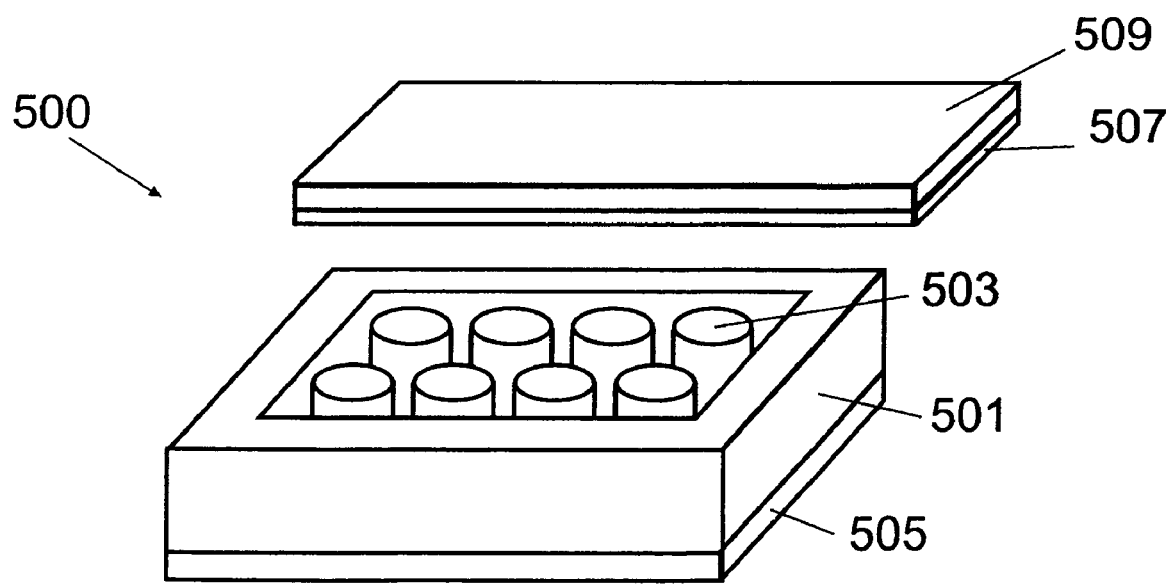

FIGS. 4 and 5 are simplified three dimensional diagrams of contact structures 400, 500 for semiconductor devices according to embodiments of the present invention. These diagrams are merely examples, which should not unduly limit the scope of the claims herein. One of ordinary skill in the art would recognize many variations, modifications, and alternatives. As shown, the diagrams are exploded views, which include ring structures 401, 501, a plurality of plug structures 403, 503, a lower plate 405, 505, an upper plate 407, 507, and a bonding pad structure 409, 509, according to a specific embodiment.

Figure 6:
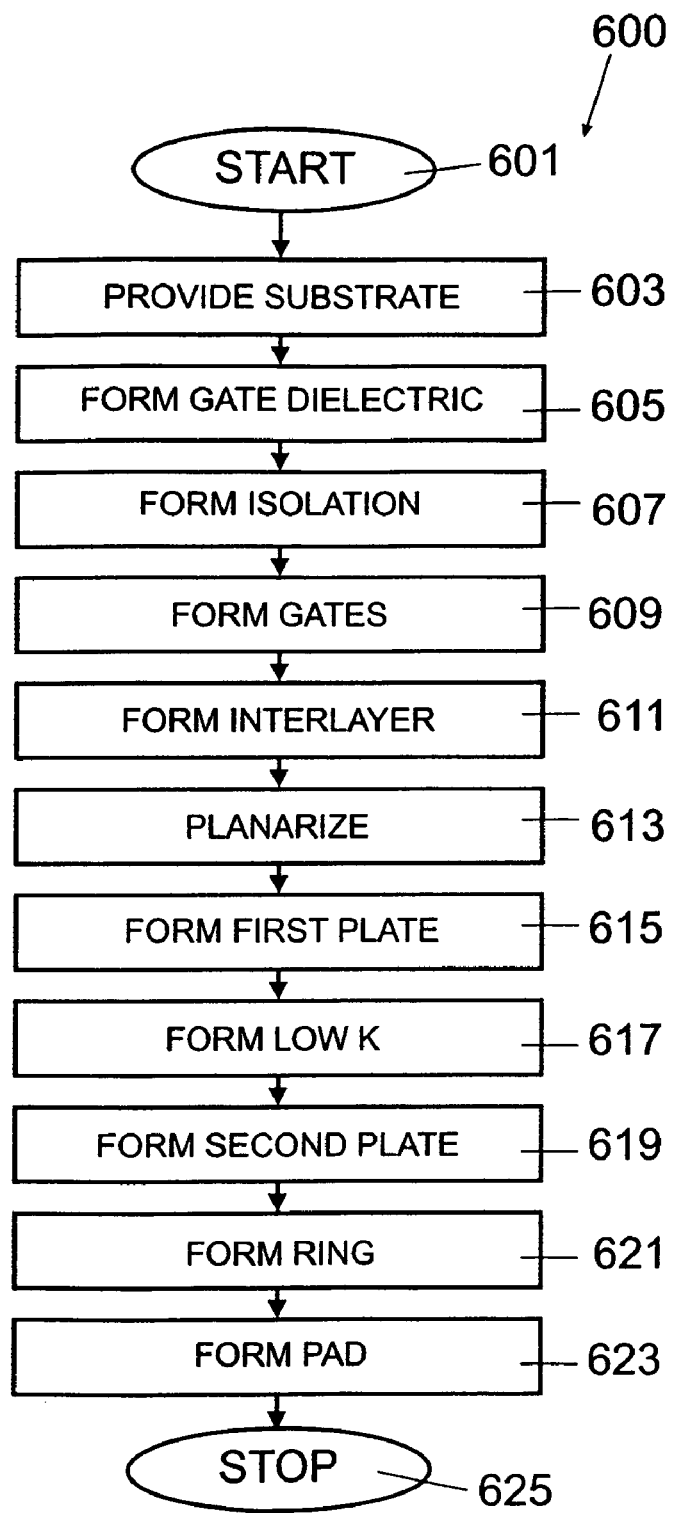
FIG. 6 is a simplified flow diagram of a method for fabricating a contact structure according to an embodiment of the present invention.

A method 600 for manufacturing a semiconductor device according to an embodiment of the present invention may be outlined as follows (see also FIG. 6):

1. Start, step 601;
2. Provide (step 603) a semiconductor substrate, e.g., silicon substrate.
3. Form (step 605) a gate dielectric structure overlying the surface region of the semiconductor substrate;
4. Form (step 607) isolation regions within the semiconductor substrate;
5. Form (step 609) a plurality of gate structures formed on a portion of the semiconductor substrate;
6. Form (step 611) a first interlayer dielectric overlying the gate structures;
7. Planarize (step 613) the first interlayer dielectric to form a substantially flat surface region of the first interlayer dielectric layer;
8. Form (step 615) a first copper interconnect layer overlying the first interlayer dielectric layer;
9. Form (step 617) a first low K dielectric layer overlying the first copper interconnect layer;
10. Form (step 619) a second copper interconnect layer overlying the low K dielectric layer;
11. Provide (step 621) a copper ring structure (or structures) enclosing an entirety of an inner region of the first low K dielectric layer and provided between the first copper interconnect layer and the second copper interconnect layer to maintain the inner region of the first low K dielectric layer;
12. Form (step 623) a bonding pad structure overlying a region within the inner region;

13. Perform other steps, as desired; and
14. Stop, step 625.

The above sequence of steps provides a method according to an embodiment of the present invention. As shown, the method uses a combination of steps including a way of forming a ring structure between first and second interconnect layers to support the low K dielectric material, which will be underlying a bonding pad structure. Other alternatives can also be provided where steps are added, one or more steps are removed, or one or more steps are provided in a different sequence without departing from the scope of the claims herein. That is, the ring structure can be a single ring structure or multiple ring structures according to a specific embodiment. Additionally, there may be other layers inserted between each of the metal layers described according to an embodiment of the present invention. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A semiconductor device comprising:
   a semiconductor substrate;
   a plurality of gate structures formed on a portion of the semiconductor substrate;
   an interlayer dielectric overlying the gate structures, the interlayer dielectric layer having a substantially flat surface region;
   a first copper interconnect layer overlying the substantially flat surface region of the first interlayer dielectric layer;
   a low K dielectric layer overlying the first copper interconnect layer;
   a second copper interconnect layer overlying the low K dielectric layer, the second copper interconnect layer having an upper surface;
   a plurality of metal ring structures enclosing an entirety of an inner region of the low K dielectric layer, the plurality of metal ring structures being provided between the first copper interconnect layer and the second copper interconnect layer to maintain the inner region of the low K dielectric layer and to provide mechanical support between the first and second copper interconnect layers, each of the metal ring structures having a dielectric material disposed in between them; and
   a bonding pad structure overlying a region within the inner region, the bonding pad structure having a bottom portion being coupled to the second copper interconnect layer, wherein the entire bottom portion is completely within the upper surface of the second copper interconnect layer.

2. The device of claim 1 wherein the plurality of metal ring structures provide mechanical support to enclose the inner region of the low K dielectric layer.

3. The device of claim 1 wherein at least one of the plurality of metal ring structures has a width ranging from about 0.1 to about 0.5 microns.

4. The device of claim 1 wherein the metal ring structures are enclosed in a barrier layer.

5. The device of claim 1 wherein the metal ring structures are enclosed in a tantalum nitride barrier layer.

6. The device of claim 1 wherein the bonding pad structure comprises an aluminum bearing material.

7. The device of claim 1 wherein the metal ring structures maintain the first low K dielectric layer within the metal ring structures during a subsequent bonding process.

8. The device of claim 1 further comprising a plurality of plug structures within the low K dielectric layer, the plurality of plug structures coupling the first copper layer and second copper layer, each of the plurality of plug structures providing mechanical support between the first copper layer and the second copper layer.

9. The device of claim 1 wherein the metal ring structures are provided in a peripheral region enclosing the entirety of the inner region of the low K dielectric layer.

10. The device of claim 1 wherein the first copper layer comprises a first portion and the second copper layer comprises a second portion, the first portion, the second portion, and the metal ring structures enclosing the entirety of the inner region of the low K dielectric layer.

11. The device of claim 1 wherein the bottom portion of the bonding pad structure is patterned.

12. The device of claim 1 wherein the bottom portion of the bonding pad structure is flat.

13. The device of claim 1 wherein the low K dielectric layer comprises a fluorinated silica glass material.

14. The device of claim 1 wherein the plurality of metal ring structures is rectangular shaped.

15. The device of claim 1 wherein the plurality of metal ring structures comprises a round cornered polygon shape.

16. The device of claim 1 wherein the plurality of metal ring structures comprises a square shape.

17. A semiconductor device comprising:
    a semiconductor substrate;
    a plurality of gate structures formed on a portion of the semiconductor substrate;
    an interlayer dielectric overlying the gate structures, the first interlayer dielectric layer having a substantially flat surface region;
    a first copper interconnect layer overlying the substantially flat surface region of the first interlayer dielectric layer;
    a dielectric layer overlying the first copper interconnect layer;
    a second copper interconnect layer overlying the dielectric layer, the second copper interconnect layer having an upper surface;
    a plurality of metal ring structures; and
    a bonding pad structure having a bottom portion being electrically and mechanically coupled to the second copper interconnect layer;
    wherein:
    the entire bottom portion of the bonding pad structure is within the upper surface of the second copper interconnect layer;
    the plurality of metal ring structures comprises a cornered polygon shape;
    each of the plurality of metal ring structures seals the dielectric layer within a center region of the metal ring structures; and
    each of the plurality of metal ring structures includes a dielectric material disposed in between them.

18. The semiconductor device of claim 17 wherein the bottom portion of the bonding pad structure is flat.

19. The semiconductor device of claim 17 wherein the bottom portion of the bonding pad structure is patterned.

20. The semiconductor device of claim 17 wherein the dielectric layer comprises a fluorinated silica glass material.

* * * * *